United States Patent
Chiu et al.

(10) Patent No.: US 10,269,560 B2
(45) Date of Patent: Apr. 23, 2019

(54) ATOMIC LAYER DEPOSITION METHOD FOR MANUFACTURING SEMICONDUCTOR STRUCTURE

(71) Applicant: TAIWAN SEMICONDUCTOR MANUFACTURING COMPANY LTD., Hsinchu (TW)

(72) Inventors: Yun-Tzu Chiu, Hsinchu (TW); Hsueh-Hui Kuo, Changhua County (TW); Lin-Jung Wu, Miaoli County (TW); Chih-Tsung Lee, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/183,118

(22) Filed: Jun. 15, 2016

(65) Prior Publication Data

US 2017/0365483 A1   Dec. 21, 2017

(51) Int. Cl.
*H01L 21/30* (2006.01)
*H01L 21/02* (2006.01)

(52) U.S. Cl.
CPC ...... *H01L 21/0217* (2013.01); *H01L 21/0228* (2013.01); *H01L 21/0231* (2013.01); *H01L 21/02211* (2013.01); *H01L 21/02274* (2013.01); *H01L 21/02315* (2013.01)

(58) Field of Classification Search
CPC ............ H01L 21/3003; H01L 21/0217; H01L 21/02274; H01L 21/0228
See application file for complete search history.

(56) References Cited

U.S. PATENT DOCUMENTS

| | | | |
|---|---|---|---|
| 2014/0193983 A1* | 7/2014 | LaVoie | C23C 16/45529 438/778 |
| 2015/0031218 A1* | 1/2015 | Karakawa | H01L 21/0217 438/792 |

* cited by examiner

*Primary Examiner* — Selim U Ahmed
(74) *Attorney, Agent, or Firm* — WPAT, P.C., Intellectual Property Attorneys; Anthony King

(57) ABSTRACT

A method for manufacturing semiconductor structure is disclosed. The method includes: providing a semiconductor substrate; hydrogenizing a surface of the semiconductor substrate; supplying a precursor to the surface of the semiconductor substrate; and supplying a reactant to the surface of the semiconductor substrate. An associated method for performing an atomic layer deposition (ALD) upon a semiconductor substrate and an associated atomic layer deposition (ALD) method are also disclosed.

20 Claims, 8 Drawing Sheets

Sidewall step coverage = b/a   Bottom step coverage = d/a

Conformity = b/c   Overhang = (c−b)/b

Aspect ratio = h/w

ATOMIC LAYER DEPOSITION METHOD FOR MANUFACTURING SEMICONDUCTOR STRUCTURE

BACKGROUND

Atomic layer deposition (ALD) is a well-known deposition technique in the semiconductor industry. ALD employs a precursor and a reactive gas to from an ALD layer on a substrate in a chamber. The deposited ALD layer typically suffers from degraded step coverage capability and conformity in high aspect ratio (AR) structures or devices of advanced technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
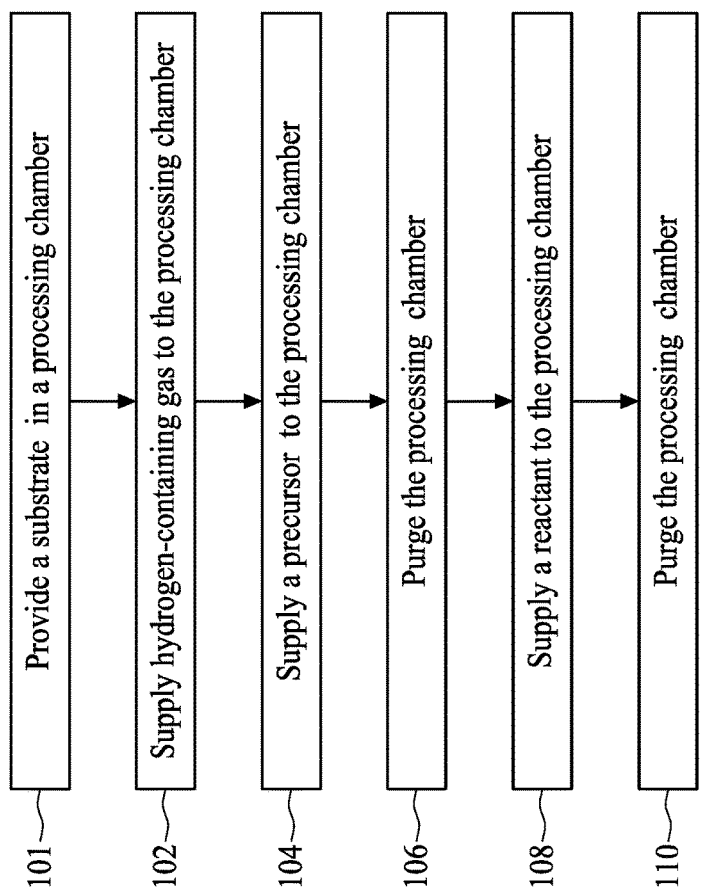
FIG. 1 illustrates a method of ALD according to an exemplary embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one dement or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Silicon nitride has a wide variety of applications, as will be apparent to the skilled artisan. Silicon nitride thin films can be deposited on a semiconductor substrate by an atomic layer deposition (ALD) process, such as a plasma-enhanced atomic layer deposition (PEALD) process or a thermal ALD processes. The thickness and composition of each of the layers can be controlled to produce a SiN film with the desired characteristics. The ALD process is a layer-by-layer process for the deposition of films. The ALD process uses a precursor gas and a reactant gas to deposit a film on a substrate housed within a processing chamber. For example, a precursor gas may be used to deposit precursor molecules onto the substrate, after which a reactant gas may be brought into contact with precursor molecules on the substrate. Heat within the processing chamber causes the reactant gas to react with the precursor molecules to form a film on the substrate. While the ALD process provides for good step coverage, depositions by way of ALD have a low throughput that limits its use.

The PEALD process can be used to provide for improved step coverage over PVD processes and higher throughput than the thermal ALD process. The PEALD process make use of an RF-plasma (e.g., precursor and reactant gases do not react with each other without plasma activation) to enable higher deposition rates and improved film electrical properties at lower temperatures when compared to the thermal ALD process.

The methods presented herein allow deposition of silicon nitride films on surface of the semiconductor substrates. However, this is not a limitation of the present disclosure. In some embodiments, the method can be alternatively applied to deposit single or composite films of W, WN, TiN, TaN, AlN, TiAlN, TaAlN, etc. Geometrically challenging applications are also possible due to the nature of the ALD processes. According to some embodiments, ALD processes are used to form silicon nitride films on semiconductor substrates, such as integrated circuit work pieces. For example, a semiconductor substrate or work piece is placed in a processing chamber and subjected to alternately repeated surface reactions. In particular, thin films are formed by repetition of an ALD cycle. In the present disclosure, each ALD cycle includes at least three distinct operations. In the first operation, a surface of the semiconductor substrate treatment is employed. In the second operation, a precursor, for example, $SiH_2Cl_2$, is provided to the chamber. In the third operation, a reactant including reactive nitrogen and hydrogen species, typically nitrogen and hydrogen containing plasma is supplied to the processing chamber to convert the adsorbed precursor compound to the silicon nitride. One or more of the reactants may be provided with the aid of a carrier gas, such as Ar or He. In certain embodiments the silicon reactant and the nitrogen and hydrogen reactant are provided with the aid of a carrier gas.

In certain embodiments, the semiconductor substrate on which deposition is desired, for example a semiconductor work piece, is loaded into a processing chamber. The processing chamber may be part of a cluster tool in which a variety of different processes in the formation of an integrated circuit are carried out. For example, a flow-type processing chamber can be utilized. Additionally, for example, a high-volume manufacturing capable single wafer ALD processing chamber or a batch processing chamber comprising multiple semiconductor substrates can be used. When implementing the present methods utilizing batch ALD processing chambers, the number of semiconductor substrates can be within the range of, for example, 10 to 200, 50 to 150, 100 to 130 or other such range therein. In certain embodiments, the semiconductor substrate can be a FinFET structure in which a silicon nitride film is deposited over a Fin or Fins by ALD.

FIG. 1 illustrates a method of ALD according to an exemplary embodiment of the present disclosure. This diagram is merely an example, which should not unduly limit the scope of the claims. One of ordinary skill in the art would recognize many variations, alternatives, and modifications. As shown in FIG. 1, a deposition cycle can begin with provision of a semiconductor substrate 101, provision of the hydrogen-containing gas 102 followed by the precursor 104 and the reactant 108. Operations 101 to 110 constitute a deposition cycle. The deposition cycle may be repeated until a film of the desired thickness is obtained. In some embodiments, the deposition cycle is determined to be the number of cycles forming a closure film. In some embodiments, the number of the deposition cycles, according to the conditions described in the present disclosure, is about 30.

Referring to FIGS. 2-6, a semiconductor substrate 20 having a surface 20' is provided into a processing chamber (not shown) the operation 101. The substrate 20 may be a bulk silicon substrate. Alternatively, the substrate 20 may be comprised of silicon oxide, and/or metal; or combinations thereof. At the operation 102, a pretreatment gas is supplied to the processing chamber to treat the the surface 20' of the semiconductor substrate 20 in particular, the surface 20' of the semiconductor substrate 20 is treated by a hydrogenation process. In some exemplary embodiments, the pretreatment gas may contain hydrogen carried by nitrogen (hereinafter $H_2/N_2$), and an atomic concentration of $H_2$ in the $H_2/N_2$ may be controlled to be within a range from about 0.1% to about 5%. In some embodiments, the atomic concentration of $H_2$ may be controlled to be within a range from about 0.1% to about 1%. In some embodiments, a flow rate of $H_2$ may be from about 5 SCCM to about 100 SCCM, and a flow rate of $N_2$ may be from about 10 SLM to about 30 SLM. In the exemplary embodiment, the pretreatment in the operation 102 may sustain a duration of about 0.1 sec to about 30 sec. The aforesaid flow rate conditions between $H_2$ and $N_2$ are adopted in the present disclosure in order to achieve a sufficiently hydrogenated surface that allows the decrease of the bonding energy between the dangling bonds protruding from the hydrogenated surface and the incoming precursor molecules, and hence facilitating operations involving bond-breaking processes. Finally, a better step coverage of patterned surface having a high aspect ratio (e.g., 2-5) can be obtained.

Figure 2:
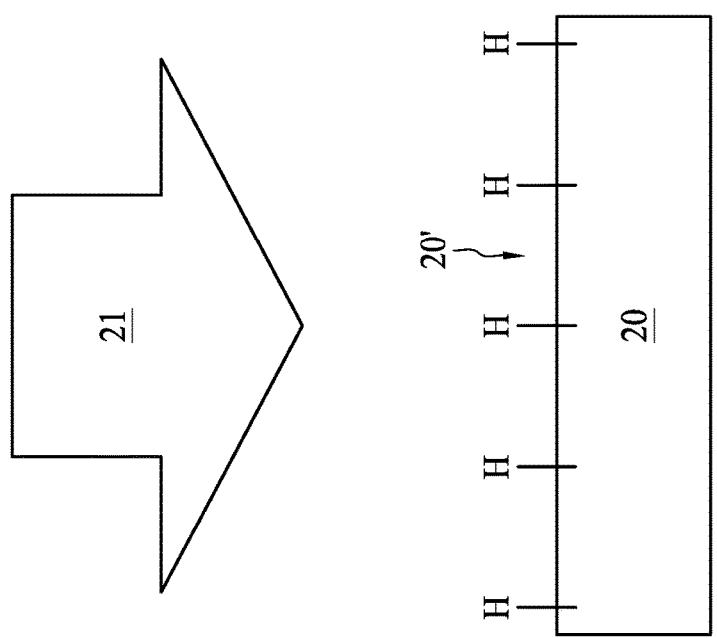
FIGS. 2-7 are schematic cross-sectional views of a semiconductor substrate at various stages of fabrication according to various aspects of the present disclosure.

During the hydrogenation process, hydrogen-containing gas 21 is supplied to induce chemical reaction on the surface 20' of the semiconductor substrate 20. In this way, the hydrogen atom can be uniformly bonded to the surface 20' by, for example, replacing the original function group dangling from the surface 20' before the hydrogenation process, leading to a hydrogen-terminated surface. FIG. 2 is a schematic cross-sectional view of the semiconductor substrate 20 after the operation 102. The semiconductor substrate 20 has a Si—H bond over the surface 20' of the semiconductor substrate 20. One of the ordinary skilled in the art may recognize many variations, alternatives, and modifications in the hydrogenation processes and possible surface atomic structures. In some embodiments, the hydrogen-containing gas 21 mentioned above may be, for example, hydrogen carried by argon (hereinafter $Ar/H_2$), $H_2O$, $H_2O_2$ or pure $H_2$ gas. In some embodiments, the pretreatment gas 21 may be activated by direct plasma, pulsed plasma, remote plasma or ultra violet (UV).

Figure 3:
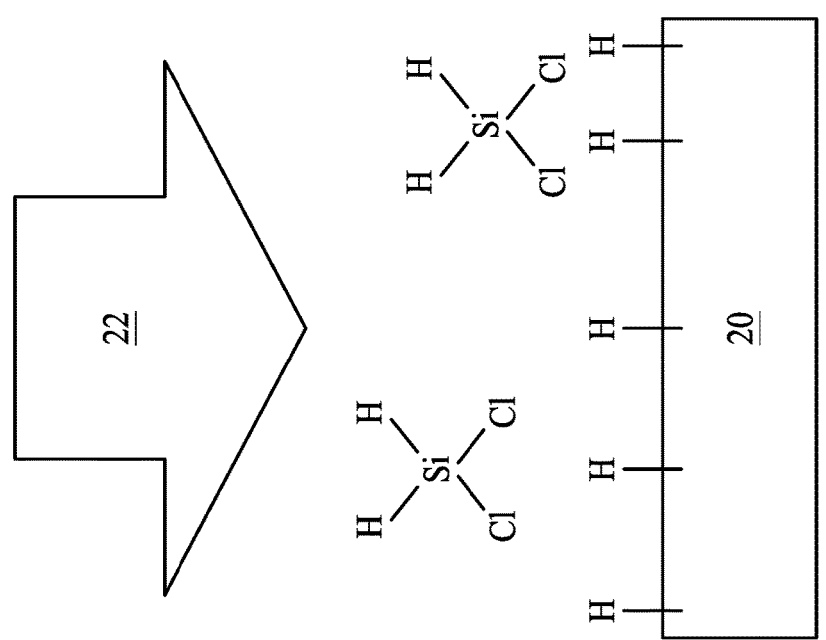
Figure 4:
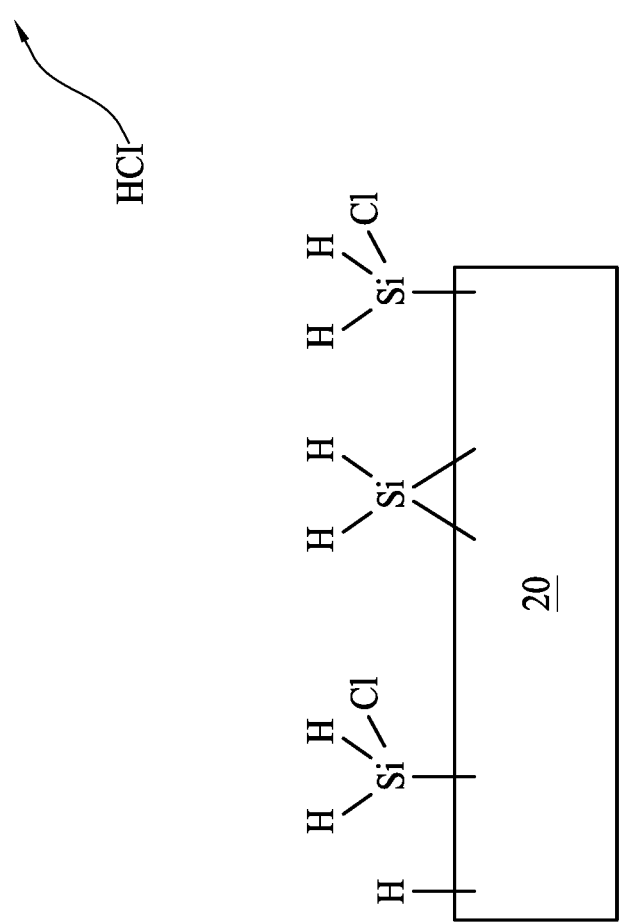

FIG. 3 shows the operation 104, in which the precursor 22 is applied on the hydrogenated surface of FIG. 2. In some exemplary embodiments, a precursor which can be utilized with the present methods may be a halide-based gas, for example, dichlorosiiane ($SiCl_2H_2$). However, this is not a limitation of the present disclosure. In some embodiments, using other precursors such as $WF_6$, $TiCl_4$, $TaCl_5$, $AlCl_3$ may be feasible as well. The precursor 22 is ionized to form a plurality of ionized precursor molecules within the processing chamber, and the precursor 22 self-saturates the surface of the semiconductor substrate 20 such that any excess constituents of the precursor do not further react with the molecular layer formed by this process. The hydrogenated surface is advantageous since the bonding energy between hydrogen and silicon atom (i.e. Si—H bond) on the surface of the semiconductor substrate 20 is lowered comparted to other bonding energy such as Si—O bond at an OH-terminating surface, and therefore the disassociated precursor molecules can be adsorbed onto the surface of the semiconductor substrate 20 more easily and more uniformly, resulting in a more continuous film and finally contribute to a better ALD step coverage. FIG. 4 is a schematic cross-sectional view of the semiconductor substrate 20, wherein on the surface of the semiconductor substrate 20, the precursor molecules are uniformly adsorbed. In some embodiments, HCl is generated as a product of the operation 104 and being purged in the following operation 106.

Figure 5:
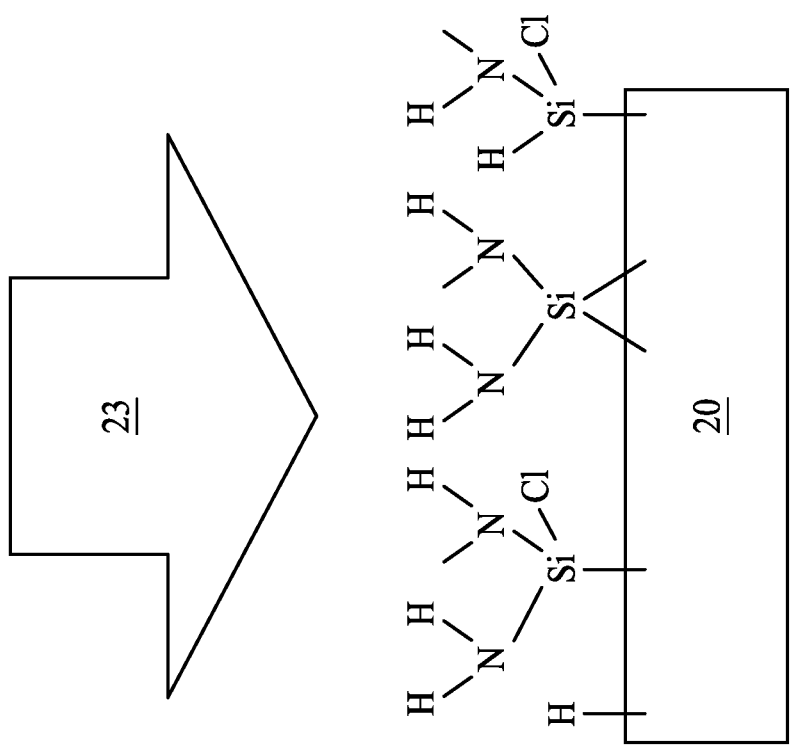

In the operation 106, a purge operation is used to remove excess precursor molecules from the surface of the semiconductor substrate 20. As a result, a residue of the precursor gas can be purged from the processing chamber. Next, in the operation 108, a reactant 23 is introduced to the processing chamber to provide nitrogen source on the surface of the semiconductor substrate 20. As shown in FIG. 5, a first SiN deposition is completed on the surface of the semiconductor substrate 20. In the exemplary embodiment, the reactant 23 may be, for example, ammonia. gas ($NH_3$). However, this is not a limitation of the present disclosure. In some embodiments, the reactant 23 may be $N_2$, $N_2/Ar$, or $N_2/He$. The operation 108 may be performed at a temperature between about 100° C. to about 600° C. and at a pressure between about 1 to 30 Torr. In particular, when a thermal ALD process is employed in the ALD method, the preferred temperature may be ranging from about 350° C. to about 650° C.; when a plasma enhanced ALD (PEALD) process is employed, the preferred temperature may be ranging from about 100° C. to about 550° C.

In some embodiments where a PEALD process is used, plasma may be ignited within the processing chamber from the reactant gas. The plasma causes a reaction between the reactant gas and ionized precursor molecules that have accumulated on the surface of the semiconductor substrate. The reaction results in an anisotropically deposited layer on the semiconductor substrate. In some embodiments, the plasma may be generated by RF inductive coupling to the reactant gas. In some embodiments, the RF plasma may comprise direct plasma that is formed at a position within the processing chamber that is directly in contact with the substrate. In other embodiments, the RF plasma may comprise remote plasma that is formed at a position that is separated from the semiconductor substrate, and which is provided to the substrate.

At operation 110, a residue of the reactant gas may be purged from the processing chamber. Purging the residue of the precursor gas removes non-reacted reactant gases (i.e., reactant gases that have not reacted with the precursor molecules on the semiconductor workpiece) and by-products of the reaction from the processing chamber.

It will be appreciated that the precursor gas and the reactant gases may be chosen based upon a material to be deposited. In various embodiments, the deposited layer may include W, WN, TiN, TaN, AlN, TiAlN, TaAlN, etc.

Figure 6:
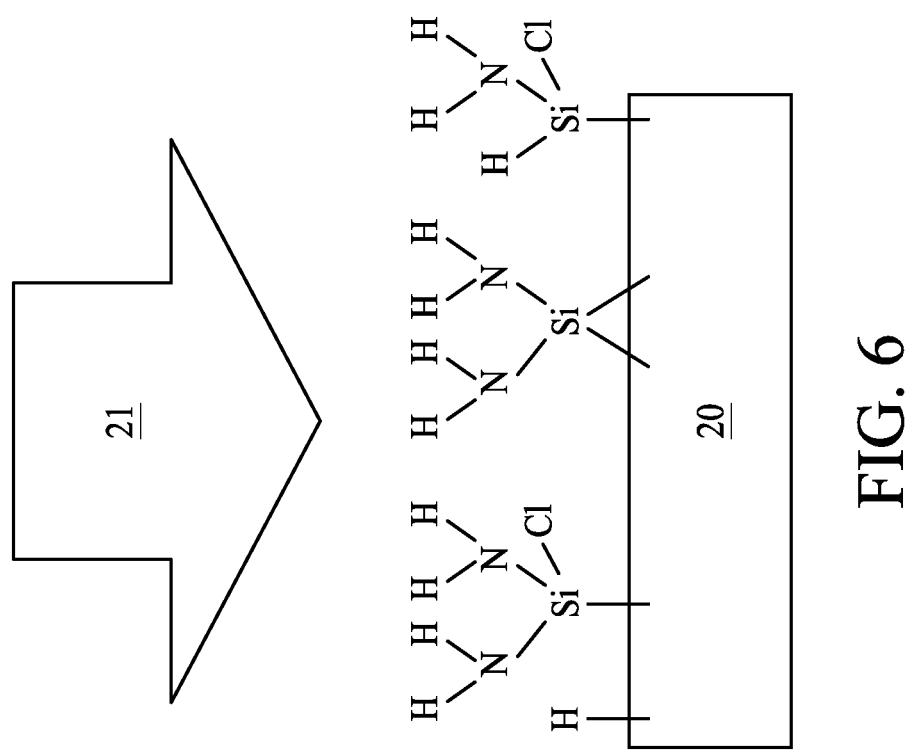

As discussed above, each complete ALD cycle of the present disclosure begins with the hydrogenation operation 102, followed by the precursor operation 104 and the reactant operation 108. The ALD cycle may be fully executed and repeated until a film of the desired thickness is obtained. FIG. 6 is a schematic cross-sectional view of the semiconductor substrate 20 after the operation 102 of a second. ALD cycle. As can be seen from FIG. 6, the semiconductor substrate 20 has a more uniformly hydrogenated surface compared to FIG. 5. The operation 102 of the second ALD cycle is substantially the same with the operation 102 of the first ALD cycle mentioned above. As a result, details regarding FIG. 6 are omitted here for brevity.

Figure 7:
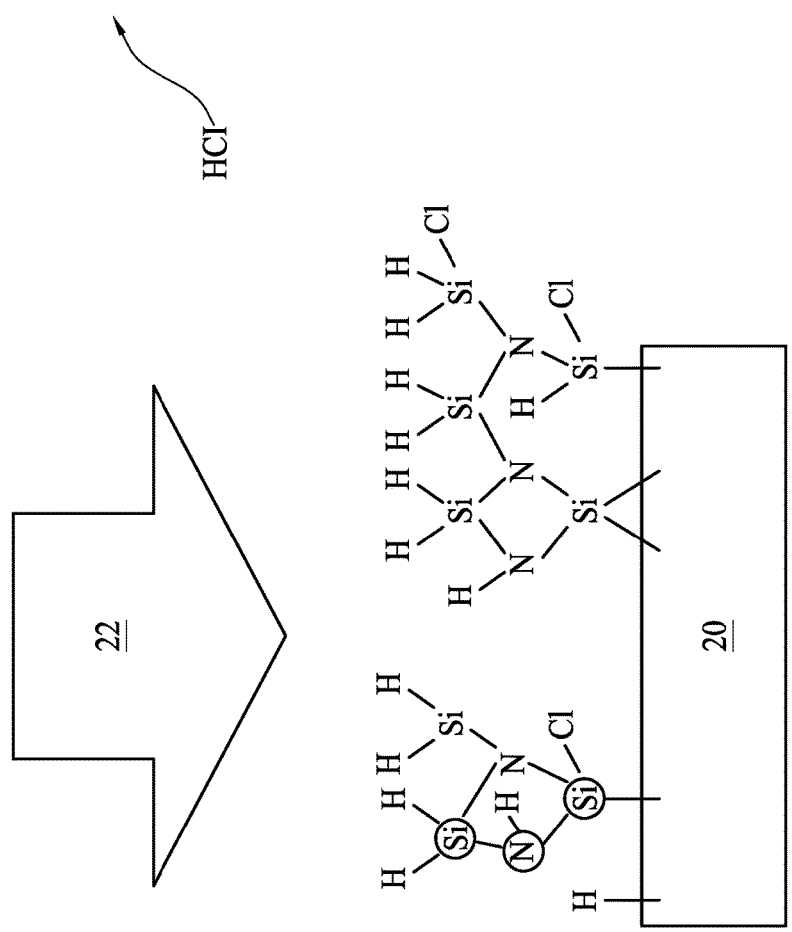

FIG. 7 is a schematic cross-sectional view of the semiconductor substrate 20 obtained after the precursor operation 104 of the second ALD cycle. As can be seen from FIG. 7, a second layer of the precursor molecules are uniformly adsorbed on the surface of the semiconductor substrate 20, thus forming a uniform Si/N/Si arrangement. The operation 104 of the second ALD cycle is substantially the same with the operation 104 of the first ALD cycle mentioned above. As a result, details regarding FIG. 7 are omitted here for brevity.

However, in some embodiments, the hydrogenation operation 102 may be also omitted after a predetermined number of the complete ALD cycle is achieved. For example, 30 complete ALD cycles may be performed in an initial stage of the deposition operation in order to ensure a continuous and uniform deposition as a healthy foundation. After the initial stage, the hydrogenation operation 102 can be omitted by the following ALD cycles to speed up the overall deposition process based on the good deposition foundation.

Figure 8:
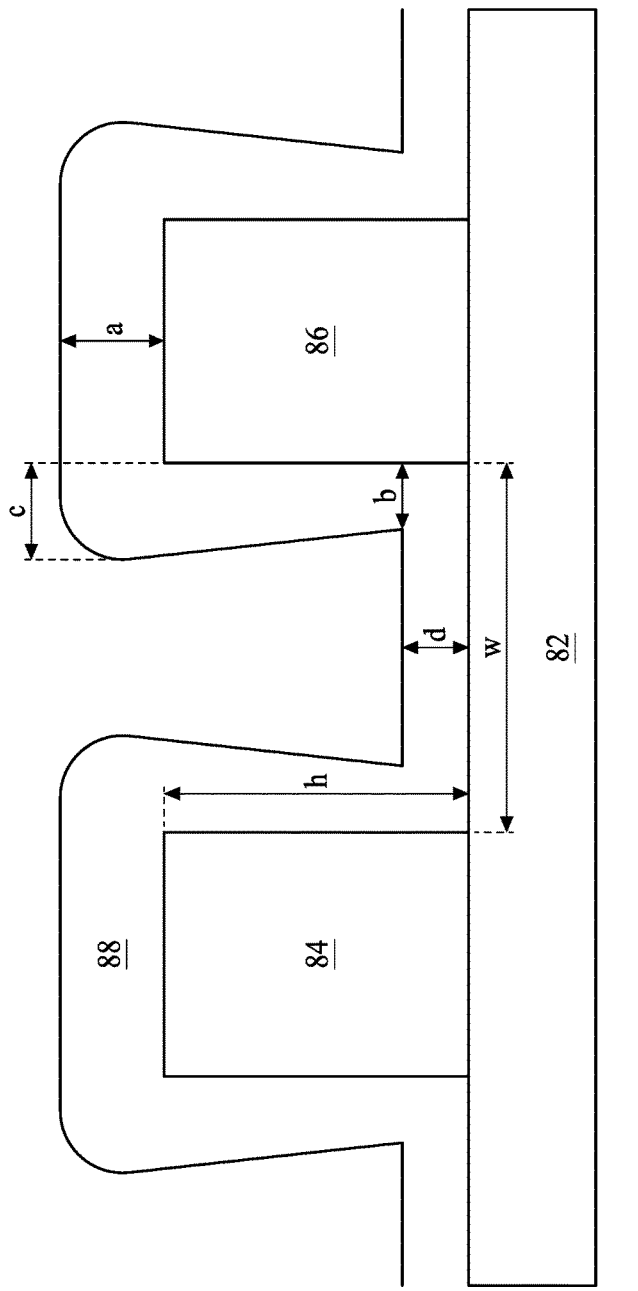
FIG. 8 is a diagram illustrating a resultant ALD structure according to an exemplary embodiment of the present disclosure.

FIG. 8 is a diagram illustrating a resultant ALD structure according to an exemplary embodiment of the present disclosure. In FIG. 8, semiconductor structures 84 and 86 are formed on a substrate 82. A film 88 is deposited over the semiconductor structures 84 and 86 and the substrate 82 by using the aforementioned ALD method with hydrogenation pretreatment process. The obtained sidewall step coverage, bottom step coverage, conformity and overhang can be significantly improved. In the exemplary embodiment, the sidewall step coverage can be improved from about 0.6 to about 0.95; the bottom step coverage can be improved from about 0.43 to about 0.95, and the conformity can be improved from about 0.37 to about 0.8.

Some embodiments of the present disclosure provide a method for manufacturing semiconductor structure, including: providing a semiconductor substrate; hydrogenizing a surface of the semiconductor substrate; supplying a precursor to the surface of the semiconductor substrate; and supplying a reactant to the surface of the semiconductor substrate.

Some embodiments of the present disclosure provide a method for performing an atomic layer deposition (ALD) upon a semiconductor substrate, including disposing the semiconductor substrate in a processing chamber; and repeating a first-phase ALD for a first predetermined cycles; wherein the first-phase ALD includes: hydrogenizing a surface of the semiconductor substrate; supplying a precursor to the surface of the semiconductor substrate; and supplying a reactant to the surface of the semiconductor substrate.

Some embodiments of the present disclosure provide an atomic layer deposition (ALD) method, including: providing a silicon substrate; forming a Si—H bond over a surface of the silicon substrate; supplying a precursor to the surface of the silicon substrate; and supplying a reactant to the surface of the silicon substrate.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for manufacturing semiconductor structure, comprising:
   providing a semiconductor substrate, wherein the semiconductor substrate includes silicon;
   bonding hydrogen atoms to a surface of the semiconductor substrate through Si—H bonds;
   supplying a precursor to the surface of the semiconductor substrate to form a layer on the surface of the semiconductor substrate through a Si—Si bond;

supplying a reactant to the layer on the surface of the semiconductor substrate; and after supplying the reactant, supplying hydrogen gas to bond hydrogen atoms to the surface of the semiconductor substrate through N—H bonds.

2. The method of claim 1, wherein the providing the semiconductor substrate comprises:

providing the semiconductor substrate in a processing chamber.

3. The method of claim 1, wherein the bonding the hydrogen atoms to the surface of the semiconductor substrate through the Si—H bonds comprises:

introducing hydrogen-containing gas to a processing chamber.

4. The method of claim 3, wherein the hydrogen-containing gas is activated by direct plasma, pulsed plasma, remote plasma or ultra violet (UV).

5. The method of claim 3, wherein the introducing the hydrogen-containing gas to the processing chamber comprises:

introducing hydrogen and nitrogen to the processing chamber.

6. The method of claim 5, wherein an atomic percent of hydrogen is in a range from about 0.1% to about 5%.

7. The method of claim 5, wherein the introducing hydrogen and nitrogen to the processing chamber comprises:

introducing hydrogen and nitrogen to the processing chamber for a duration of about 0.1 sec to about 30 sec.

8. The method of claim 3, wherein the introducing the hydrogen-containing gas to the processing chamber comprises:

introducing argon and hygrogen, $H_2O$, or $H_2O_2$ to the processing chamber.

9. The method of claim 8, wherein the supplying the precursor to the surface of the semiconductor substrate comprises:

supplying halide-based molecules to the surface of the semiconductor substrate.

10. The method of claim 9, wherein the supplying the halide-based molecules to the surface of the semiconductor substrate comprises:

supplying dichlorosilane ($SiCl_2H_2$) to the surface of the semiconductor substrate.

11. The method of claim 1, wherein the supplying the reactant to the surface of the semiconductor substrate comprises:

supplying ammonia molecules ($NH_3$) to the surface of the semiconductor substrate.

12. The method of claim 1, further comprising:

purging the precursor from the processing chamber before supplying the reactant.

13. The method of claim 1, further comprising:

purging the reactant from the processing chamber.

14. A method for performing an atomic layer deposition (ALD) upon a semiconductor substrate, comprising:

disposing the semiconductor substrate in a processing chamber, wherein the semiconductor substrate includes silicon;

supplying hydrogen gas to bond hydrogen atoms to a surface of the semiconductor substrate through Si—H bonds;

supplying a precursor to the surface of the semiconductor substrate to form a first layer on the surface of the semiconductor substrate through a Si—Si bond;

supplying a reactant to the first layer on the surface of the semiconductor substrate; and repeating a first-phase ALD for a first predetermined cycles;

wherein the first-phase ALD includes:

supplying hydrogen gas to bond hydrogen atoms to the surface of the semiconductor substrate through N—H bonds;

supplying the precursor to the surface of the semiconductor substrate to form a second layer on the surface of the semiconductor substrate through a Si—N bond; and supplying the reactant to the second layer on the surface of the semiconductor substrate.

15. The method of claim 14, further comprising:

repeating a second-phase ALD for a second predetermined cycles;

wherein the second-phase ALD includes:

supplying the precursor to the surface of the semiconductor substrate; and supplying the reactant to the surface of the semiconductor substrate.

16. The method of claim 15, wherein the second-phase ALD is performed after the first-phase ALD being performed for the first predetermined cycles.

17. The method of claim 14, wherein the first-phase ALD cycle further comprises:

purging the precursor from the processing chamber before supplying the reactant;

purging the reactant from the processing chamber.

18. An atomic layer deposition (ALD) method, comprising:

providing a silicon substrate, wherein a surface of the silicon substrate includes a first plurality of function group danglings;

forming a plurality of Si—H bonds over the surface of the silicon substrate to replace the first plurality of function group danglings;

supplying a precursor to the surface of the silicon substrate to form a layer on the surface of the semiconductor substrate through a Si—Si bond;

supplying a reactant to the layer on the surface of the silicon substrate; and after supplying the reactant, supplying hydrogen gas to bond hydrogen atoms to the surface of the semiconductor substrate through N—H bonds.

19. The ALD method of claim 18, wherein the supplying the reactant to the surface of the silicon substrate comprises:

supplying the reactant to the surface of the silicon substrate at a temperature between about 100° C. to about 600° C.

20. The ALD method of claim 18, wherein the supplying the precursor to the surface of the silicon substrate comprises:

breaking the Si—H bond over the surface of the silicon substrate.

* * * * *